(12) United States Patent
Wescott et al.

(10) Patent No.: US 9,278,483 B2
(45) Date of Patent: Mar. 8, 2016

(54) ADDITIVE LAYER FABRICATION METHOD

(75) Inventors: Andrew David Wescott, Bristol (GB);
Benjamin Richard Moreland, Church Stretton (GB); Jagjit Sidhu, Bristol (GB)

(73) Assignee: BAE SYSTEMS PLC, London (GB)

( * ) Notice: Subject to any disclaimer, the term of this patent is extended or adjusted under 35 U.S.C. 154(b) by 1167 days.

(21) Appl. No.: 13/318,947

(22) PCT Filed: Apr. 27, 2010

(86) PCT No.: PCT/GB2010/050686
§ 371 (c)(1),
(2), (4) Date: Feb. 21, 2012

(87) PCT Pub. No.: WO2010/125381
PCT Pub. Date: Nov. 4, 2010

(65) Prior Publication Data
US 2012/0132631 A1 May 31, 2012

(30) Foreign Application Priority Data

Apr. 28, 2009 (EP) .................................... 09275030
Apr. 28, 2009 (GB) .................................... 0907226.5

(51) Int. Cl.
| | |
|---|---|
| *B23K 26/342* | (2014.01) |
| *B29C 67/00* | (2006.01) |
| *B22F 3/105* | (2006.01) |
| *B23K 35/02* | (2006.01) |
| *B23K 26/32* | (2014.01) |
| *C23C 24/00* | (2006.01) |

(Continued)

(52) U.S. Cl.
CPC ........... *B29C 67/0077* (2013.01); *B22F 3/1055* (2013.01); *B23K 26/32* (2013.01); *B23K 26/342* (2015.10); *B23K 35/0244* (2013.01); *B22F 2003/1056* (2013.01); *B23K 2203/50* (2015.10); *C23C 16/483* (2013.01); *C23C 24/00* (2013.01); *Y02P 10/295* (2015.11)

(58) Field of Classification Search
CPC ............................. B23K 26/00; B23K 26/342
USPC .......... 257/E23.15, 529; 219/121.39, 121.44, 219/121.6, 121.85, 121.65, 121.66, 219/121.61–121.64; 148/513, 565; 419/8, 419/9; 427/597, 554, 556
See application file for complete search history.

(56) References Cited

U.S. PATENT DOCUMENTS 5,580,472 A * 12/1996 Maybon .................... 219/121.66
5,837,960 A * 11/1998 Lewis et al. ............... 219/121.63

(Continued)

FOREIGN PATENT DOCUMENTS

DE    102005007792 A1 *  8/2006
WO    2006/120372 A1    11/2006

OTHER PUBLICATIONS

Radaj, "Heat Effects of Welding Temperature Filed, Residual Stress Distortion" Spring-Verlag Berlin Heidelberg, (1992), 5 pages.

*Primary Examiner* — Samuel M Heinrich
(74) *Attorney, Agent, or Firm* — Maine Cernota & Rardin

(57) ABSTRACT

A selective layer melting or other additive layer fabrication method in which powdered material is fused by heating it with a pulsed laser, the pulses being modulated while the laser is traversing the substrate so as to control the thickness and/or width of the layer being formed. Initial layers of the fabrication structure may be formed more thickly than subsequent layers, e.g. by means of a CW laser, to reduce distortion. This aspect of the invention may be employed independently of the use of a pulsed laser to form the subsequent layers.

7 Claims, 3 Drawing Sheets

(51) Int. Cl.
*C23C 16/48* (2006.01)

(56) References Cited

U.S. PATENT DOCUMENTS

| | | | |
|---|---|---|---|
| 5,902,538 A * | 5/1999 | Kruger et al. | 264/401 |
| 5,912,057 A * | 6/1999 | Nishimura et al. | 427/597 |
| 6,744,005 B1 | 6/2004 | Beyer et al. | |
| 7,521,017 B2 * | 4/2009 | Kunze et al. | 419/8 |
| 2002/0004105 A1 * | 1/2002 | Kunze et al. | 427/586 |
| 2002/0135043 A1 * | 9/2002 | McDevitt et al. | 257/529 |
| 2003/0010409 A1 * | 1/2003 | Kunze et al. | 148/513 |
| 2003/0183270 A1 * | 10/2003 | Falk et al. | 136/258 |
| 2009/0074987 A1 * | 3/2009 | Auyeung et al. | 427/596 |
| 2009/0117352 A1 * | 5/2009 | Burrows et al. | 428/209 |

* cited by examiner

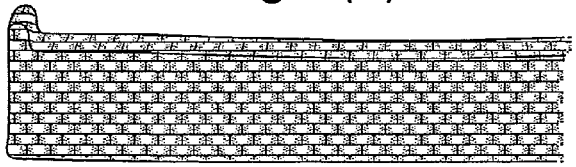
Fig.3(a).
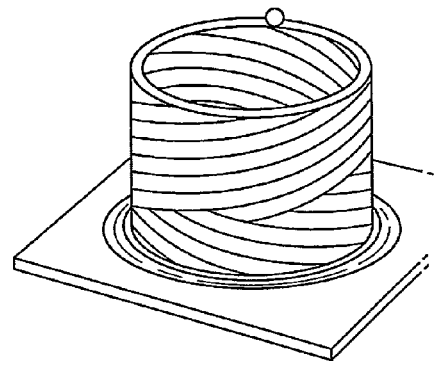
Fig.3(b).
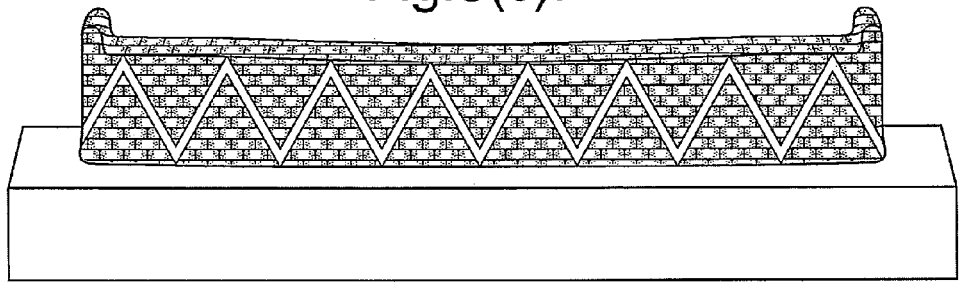
Fig.3(c).
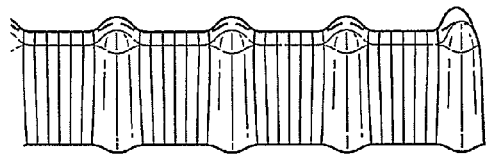
Fig.3(d).
Fig.4.
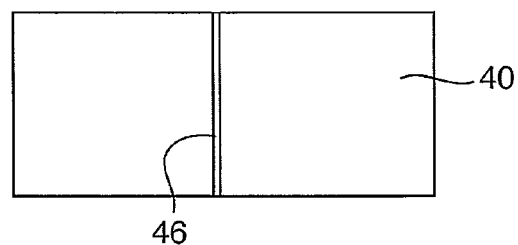
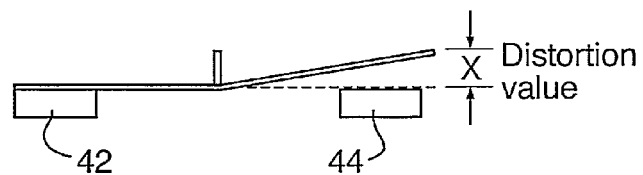

CW Layers only
Parent plate

Pulsed layers only

CW layers followed by pulsed layers

Pulsed layers followed by CW layers

5mm

14mm 4.7mm 13.8mm

ADDITIVE LAYER FABRICATION METHOD

BACKGROUND TO THE INVENTION

This invention relates to an additive layer fabrication (ALF) method, that is to say a method in which successive layers of material are added on top of each other so as to build-up a three-dimensional structure. The invention is particularly but not exclusively applicable to selective laser melting, and may be applied both to the manufacture of new articles, or to the repair of used ones.

In selective laser melting a laser beam is used to melt a controlled amount of powdered (usually metallic) material on a substrate, so as to form a layer of fused material thereon. By moving the laser beam relative to the substrate along a predetermined path, the layer can be defined in two dimensions on the substrate, the width of the layer being determined by the diameter of the laser beam where it strikes the substrate. Repeating the movement of the laser along all or part of its path enables further layers of material to be deposited, thereby fabricating a three-dimensional object.

Selective laser melting hitherto has been performed using continuous wave (CW) lasers, typically Nd:YAG lasers operating at 1064 nm. This can achieve high material deposition rates particularly suited for repair applications or where a subsequent machining operation is acceptable in order to achieve the finished component. The method does not however lend itself to the production of near-net-shape components to close tolerances and with a high quality surface finish. Preferred embodiments of one aspect of the present invention seek to address this shortcoming.

SUMMARY OF THE INVENTION

The invention provides in a first aspect a method of fabricating an object comprising applying heat to powdered material by means of a laser beam so as to fuse it into a layer on a substrate or on a previously formed layer characterised in that the laser beam is a pulsed laser beam, and the thickness and/or width of the layer is controlled by modulating the laser beam pulses whilst the beam is traversing the substrate.

Modulating the laser beam pulse enables the amount of heat applied to the powder to be accurately and precisely controlled.

By using a pulse-modulated laser, much finer control of the fabrication process can be achieved. We have found it possible to produce layers as little as 10 μm thick.

By "traversing" we mean moving along a predetermined path e.g. under computer control. Traversing is not limited to moving in a straight line from one edge of the substrate to the other.

The quantity of powdered material which is fused to form the layer, and thus the thickness of the layer depends inter alia on the power per unit area (specific power) applied by the laser to the material as it traverses the substrate and on the other operating parameters of the laser, the powder feed rate and the traverse speed. Modulating the pulse shape and/or duration provides a means of controlling the specific power for a given traverse rate. By modulating the laser beam pulse during a traverse, the thickness of the layer deposited during that traverse can be varied. This can result in decrease in manufacturing time compared to a method in which the layer thickness is constant and vertical profiling is achieved by depositing a layer only during part of the traverse.

Modulation during the traverse also enables the side surfaces of the layered structure to be profiled or patterned, whether to provide structural reinforcement, or for decorative purposes or otherwise. This is achieved by controlling the timing of corresponding modulation events in successive layer-forming traverses of the laser beam: repeating modulation events at the same times during each traverse will build features extending vertically (orthogonally to the substrate) whereas advancing or delaying them relative to the corresponding events of the previous traverse will result in features inclined to the substrate rearwardly or forwardly relative to the direction of motion of the traversing laser beam.

The powdered material may be delivered to the point of application of the laser to the object (the "laser spot") at a rate related to the power of the laser beam.

The method may be repeated at least once so as to form at least one further layer on top of a previously-formed layer.

A problem we have encountered in some instances of selective laser melting according to the invention is that of excessive distortion of the substrate compared to that which occurs when CW laser power is used.

In selective laser melting, the laser beam creates a weld pool into which the powdered material is deposited, in a similar manner to which a welder manually adds filler wire to a weld pool created in conventional electric arc welding processes but on a much smaller scale. During formation of the initial layers on the substrate, the substrate thus is subjected to intense localised heating, creating steep thermal gradients between the molten material and the cold material further away. If the transverse compressive stresses caused by the very hot expanding material exceed the yield point of the material then compressive plastic yielding (CPY) will occur in the surrounding material. On cooling and shrinkage high tensile transverse residual stresses across the "weld" will be created and these will be balanced by compressive residual stresses further away. It is these compressive residual stresses that cause buckling distortion when they exceed the critical buckling load (CBL) of the substrate. Welding distortion and residual stress generation is described for example, by Rajad, D. in "Heat Effects of Welding—Temperature Field, Residual Stress, Distortion". Springer-Verlag, Berlin, (1992).

We have found that the distortion can be reduced if the layers nearest the substrate are formed more thickly that those further from it, so that fewer traverses of the laser are needed to establish a foundation for the fabricated structure. This reduces the number of times the substrate is heated to an extent which gives rise to the distortion. Accordingly, when the at least one previously formed layer is adjacent or close to the substrate, it may be formed to be thicker than the at least one further layer, whereby to reduce distortion of the substrate.

Thus, in a second aspect the invention provides a method of fabricating an object comprising applying heat by means of a laser beam to powdered material so as to fuse it into a layer on a substrate and repeating the process to build up a stack of layers one on top of the other, wherein the said application of heat is sufficient to create a local pool of molten material and wherein the layer or layers nearest to the substrate are formed to be thicker than those further from it, whereby to reduce distortion in the substrate.

When the first and second aspects of the invention are used together, the thinner said layers are formed by applying heat by means of a pulsed laser. Preferably the thicker said layers are formed by applying heat by means of a continuous wave laser. Alternatively the thicker layers may be formed by another method which will fuse a greater quantity of powdered material in a single pass for example by increasing the peak power and/or the duty cycle of a pulse-modulated laser and/or by reducing the traverse speed. Whatever method is used, care of course must be taken so that the supply of powder is at an adequate rate for the thicker layer to be formed.

The at least one thicker layer may be such that the formation of subsequent thinner layers does not result in material deformation of the substrate.

Further aspects of the invention provide additive layer fabrication apparatus configured for the purpose of operating a method as set forth above, and a computer program which when installed and operated performs a method as set forth above.

DESCRIPTION OF THE PREFERRED EMBODIMENT

The invention will now be described merely by way of example with reference to the accompanying drawings, wherein FIG. 1 shows an apparatus for implementing the method of the invention, FIG. 2 shows waveforms of a laser beam produced in the apparatus of FIG. 1;

FIG. 3 shows structures fabricated by means of the invention;

FIGS. 4 and 5 illustrate experiments performed to demonstrate an aspect of the invention.

Figure 1:
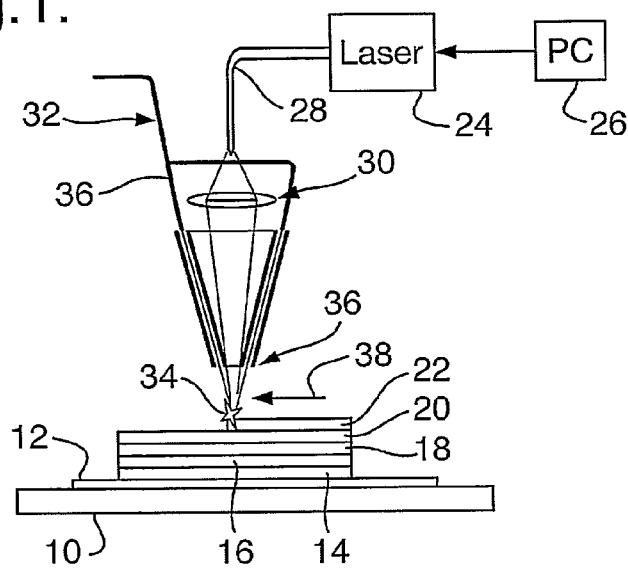

Referring to FIG. 1, an apparatus for selective laser melting comprises a base plate 10 configured to receive a workpiece comprising a parent plate or substrate 12 on to which successive layers of material 14, 16, 18, 20, 22 are built-up as described hereinafter. A laser generator 24 is controlled by a computer 26 to deliver a laser beam via an optical fibre 28 to conventional focusing optics 30, which focus the laser beam to a spot 34 on the surface of the work piece. A powder delivery system 32 (also known per se) delivers powder to the vicinity of the laser spot 34 on the workpiece surface. The delivery system comprises three pipes 36 (only two shown) arranged at 120° intervals around the laser spot.

The laser apparatus 28, 30 is mounted so as to be moveable under the control of the computer 26 in the X-Y plane parallel to the base plate surface, and vertically in the Z direction orthogonal to it. The laser spot 34 thus can be directed to any point in the working envelope in the X-Y plane, and vertically so as to accommodate workpieces of different height, and regions of different height within workpieces. As illustrated in the figure, the traverse direction is in the direction of arrow 38, the apparatus being in the process of fabricating the layer 22.

The laser apparatus 24 is an Nd:YAG laser operating at a wavelength of 1064 nm, and having a CW power output of 500 w. The computer 26 is programmed to control it either in the CW mode or a pulsed mode.

In an experiment, the apparatus was used with the laser operating in pulsed mode to produce an additive layer structure. The substrate 12 was a plate of 316L stainless steel 100 mm×70 mm×1.5 m thick. The powdered material was 316L stainless steel. The operating parameters were as follows:

| Average laser power | 250 w (=maximum laser power × repetition rate × pulse duration) |
|---|---|
| Maximum laser power | 500 w |
| Pulse repetition rate | 10 Hz |
| Pulse duration | 50 ms |
| Laser spot size | 600 μm diameter |
| Traverse rate | 5 mm/s |
| Powder feed rate | 5 g/min |

The average laser power and the powder feed rate were held constant throughout the experiment.

Figure 2A:
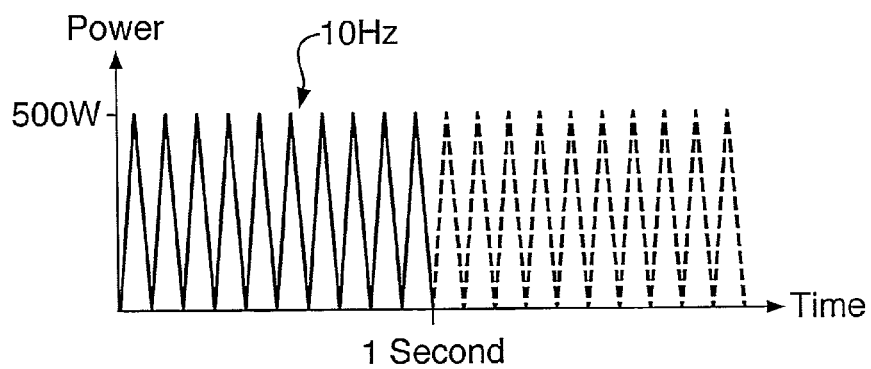

FIG. 2(a) shows the pulsed laser power output. In a single traverse, the apparatus produced a fused layer of material on the substrate surface of a substantially constant thickness of approximately 40 μm.

Figure 2B:
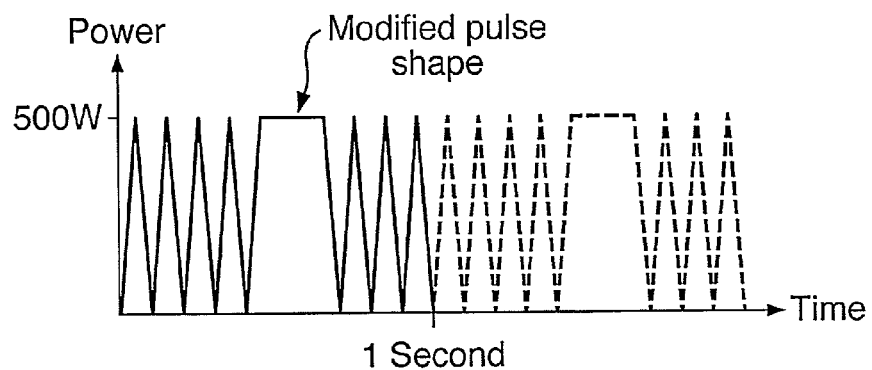

In FIG. 2(b), there is shown a pulse modulated laser output waveform in which periodically (for 300 ms in every second) the average power of the laser is increased from 250 w to 500 w. In other words the duty cycle of each pulse is increased from 50% to 100%. During these periods a larger quantity of material is fused by the laser onto the substrate, resulting in a thicker layer. The feed rate of the powder either is increased to cater for this increased demand, or alternatively powder in fed at the maximum rate required at any time during the traverse, and the excess powder is collected and re-used.

In the experimental apparatus, the laser pulses were nominally of triangular shape, as shown in FIG. 2. Other pulse shapes may be used for example a square-wave shape, the power of the laser then being controlled by modulating the mark/space ratio (on/off duration) of the pulses within the pulse repetition period.

FIGS. 3a to 3d show some additive layer fabrications produced by means of the invention. FIG. 3a shows a fence-like structure, the side (vertical) surfaces of which exhibit a basket-weave pattern. FIG. 3b shows a cylindrical structure in which the sides exhibit a helical pattern. FIG. 3C shows another fence-like structure in which the side surfaces have a zig-zag or herringbone pattern. Finally, FIG. 3d shows a fence patterned as woven material strung between intermediate posts. These finely-detailed patterns are achieved by means of the linear resolution obtainable in the traverse direction. For example in FIG. 2, a pulse repetition rate of 10 Hz and a traverse speed of 5 mm/s implies a feed rate of 0.5 mm/pulse. A traverse speed of 2 mm/s yields a feed rate of 0.2 mm/pulse which would enable a finer pattern to be resolved in the fabricated product. For a constant layer thickness, the power of the laser is reduced proportionally to the feed rate. Variation in width (transversely of the traverse direction) of the built-up structure can be achieved by increasing both the pulse duty cycle and the laser spot size simultaneously, so that the deposited layer is wider but not thicker.

Alternatively it can be achieved with constant laser spot size by increasing the "interaction time" of the laser. The interaction time is the time for which the laser spot is incident on an area of the workpiece, and for a given laser power and spot area is a measure of the specific power (energy per unit area per unit time applied to the workpiece) mentioned earlier. Increasing the specific power whether by increasing the interaction time or the laser power, results in a larger weld pool, which in turn allows more powder to be taken up. Thus a wider deposit of material can be achieved.

Substantially wider formations, for example the 'posts' in FIG. 3(d) can be fabricated by multiple traverses in which the laser is operated only transiently where a post is required to be built up. Patterns on the side surfaces of the structure such as in FIGS. 3(a) and 3(c) are achieved by delaying or advancing corresponding modulation events in successive passes. Advancing each event slightly results in a pattern rearwardly-inclined relative to the traverse direction (assuming successive passes are in the same direction). Delaying each event provides a forwardly-inclined pattern.

FIG. 4 shows a series of experiments undertaken to demonstrate distortion arising during selective laser melting, and the improvement which can be obtained with an aspect of the present invention.

In each experiment, a sample plate 40 of 316L stainless steel 100 mm×70 mm×1.5 mm thick was clamped at one end to a support 42 on the base plate 10 of the FIG. 1 apparatus. The other end of the sample plate was supported by but not clamped to a support 44. An additive layer fabrication structure 46 comprising several superimposed layers was formed on the plate using 316L powder by means of the apparatus of FIG. 1. The experiment was performed using either continuous wave laser power or pulse modulated laser power. The operating parameters were:

| CW Mode | |
|---|---|
| Laser Power | 250 w |
| Spot size | 600 μm diameter |
| Traverse rate | 5 mm/s |
| Powder Feed rate | 5 g/min |
| Pulse Modulated Mode | |
| Average power | 250 w |
| Maximum power | 500 w |
| Repetition rate | 10 Hz |
| Pulse duration | 50 ms |
| Spot Size | 600 μm diameter |
| Traverse rate | 5 mm/s |
| Powder feed rate | 5 g/min |

Figure 5A:
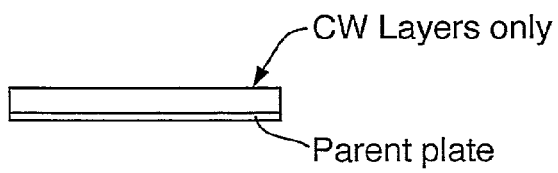
Figure 5B:
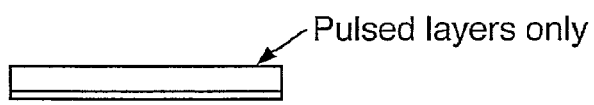
Figure 5C:
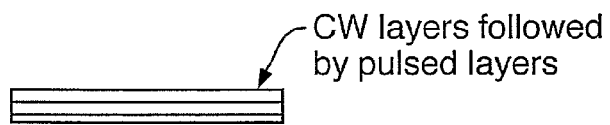
Figure 5D:
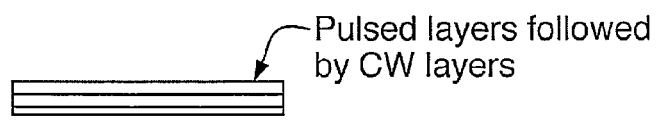
Figure 6A:
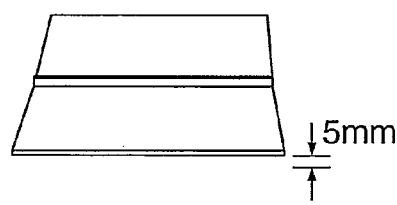
FIG. 6 shows test pieces fabricated in the experiments.
Figure 6B:
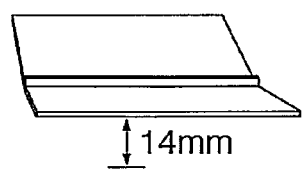
Figure 6C:
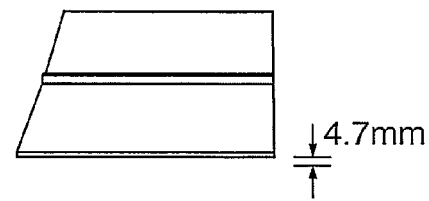
Figure 6D:
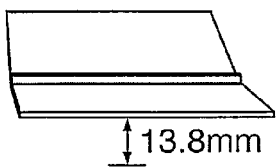

The experiment was performed four times, forming additive layer fabricated structures of fused material as follows:
a) 10 layers were built to a height of 2 mm using CW laser power (FIG. 5a)
b) 50 layers were built to a height of 2 mm using pulsed laser power (FIG. 5b)
c) 5 layers were built using CW laser power followed by 25 layers using pulsed laser power to a total height of 2 mm (FIG. 5c)
d) 25 layers were built using pulsed laser power followed by 5 layers using CW laser power, to a total height of 2 mm (FIG. 5d).

FIG. 6 shows the results of the four experiments. In experiment (a), the use of CW laser power only resulted in distortion of the free edge of the substrate 40 by 5 mm (FIG. 6a). The use of pulsed laser power only (experiment (b), FIG. 6(b)) resulted in much greater distortion of 14 mm. This is thought to be due to the greater total heat input to the substrate due to the larger number of thin layers deposited using the pulsed laser technique. In contrast, building up the structure initially by the use of CW laser power in experiment (c), FIG. 6c, resulted in 4.7 mm distortion, approximately the same as in experiment (a). Building up the structure first by pulsed laser power followed by CW laser power (experiment (d), FIG. 6d) resulted in as much distortion as did the use of pulsed laser power alone in experiment (b).

These experiments suggest that to reduce distortion it is advantageous to commence building an ALF structure using CW laser power, and then continuing with pulsed laser power to obtain the advantages of precision and surface finish discussed above. There appears to be a "threshold build height" (TBH) above which the use of pulsed laser power does not increase distortion: in the case of experiment (c), five CW layers of total thickness approximately 1 mm were sufficient, which suggests that TBH in this case was at or below that thickness. Because the conditions of each additive layer fabrication are specific to that fabrication it necessary to determine the TBH by experiment or by reference to other similar fabrications. The guiding principle is that when the TBH is achieved, heat from the laser spot is distributed in the fabricated structure and so is not concentrated on a small area of the substrate. Compressive plastic yielding and the subsequent residual stresses and distortion thus can be avoided or reduced. Of course, residual stresses can be further reduced by annealing or other heat-treatment after the additive layer fabrication has been effected.

Although the invention has been described with reference to the selective laser melting variant of ALF, it is applicable also to other ALF methods such as selective laser sintering, in which the heat input to the powder is sufficient to fuse individual particles together but is not sufficient to form a molten pool of material. In those variants, the amount of distortion may be reduced and the fabrication of preliminary CW layers may not be necessary.

Furthermore, although described with reference to powdered metallic material, other fusible powdered materials may be used with operating parameters appropriate to those materials as will be known to those skilled in the art. Examples of such powders are mixtures of glass or carbon fibres or metallic particles (e.g. aluminium, titanium or steel) mixed with polyimide, polystyrene or other thermoplastic polymers, or greensand.

Features in a built-up structure which extend significantly in a direction not perpendicular to the parent plate or substrate can be achieved by supporting the workpiece on a multi-axis manipulator or table so that its orientation relative to the (vertical) laser axis can be adjusted. For example to build up feature extending at 60° to the parent plate, the plate itself must be set at 60° to the laser axis.

It will be appreciated that the underlying purpose of initially using CW laser power is to increase the specific power applied to the laser and hence the rate at which powdered material is fused into a layer on the substrate thereby producing a thicker layer in a single pass. This does not intrinsically require CW power: the same effect can be achieved by increasing the peak power of a pulsed laser, or increasing the duty cycle of its pulses, or reducing the traverse rate.

It also will be appreciated that the distortion-reducing technique can be applied independently of the use of a pulsed laser: it may be useful whenever a structure is to be fabricated by building up thin layers by a method in which the heat repeatedly applied by the laser in the many traverses would otherwise result in excessive distortion as already discussed. Of course this alternative method of fabricating multi-layered structures may not yield the accuracy, controllability, or surface finish obtainable by the use of the pulsed laser.

Thus to summarise, the invention provides in one aspect a selective layer melting or other additive layer fabrication method in which powdered material is fused by heating it with a pulsed laser. In another aspect, initial layers of the fabrication structure may be formed more thickly than subsequent layers, e.g. by means of a CW, laser to reduce distortion. This aspect of the invention may be employed independently of the use of a modulated pulsed laser to form the subsequent thinner layers.

The invention claimed is:
1. A method of fabricating an object, comprising:
applying heat by at least one laser beam to powdered material so as to fuse the material into a layer on a substantially flat substrate; and
repeating the applying of heat by said at least one laser beam to said powdered material to build up a stack of layers one on top of the other, wherein an application of heat by said at least one laser beam is sufficient to create a local pool of molten material and wherein a layer or layers nearest to the substrate are formed to be thicker than those further from the substrate, whereby to reduce distortion in the substrate.

2. The method of claim 1, wherein thinner layers are formed by applying heat by a pulsed laser.

3. The method of claim 1, wherein thicker layers are formed by applying heat by a continuous wave laser.

4. The method of claim 2, wherein thicker layers are formed by applying heat by operating the pulsed laser at a higher duty cycle than for thinner layers.

5. The method of claim 1, wherein the thicker layers are formed by traversing the laser beam across the substrate at a lower speed than for thinner layers.

6. Fabrication apparatus configured for performing the method of claim 1, the apparatus comprising:
   a laser device for applying the heat; and
   a computer containing a tangible medium programmed to control the laser according to the claim 1 method.

7. A computer program which when installed and operated causes a fabrication apparatus to perform the method of claim 1.

* * * * *